(12) United States Patent
Lu et al.

(10) Patent No.: US 6,558,110 B2
(45) Date of Patent: May 6, 2003

(54) TRAY INPUT-OUTPUT MODULE

(75) Inventors: Weng-Jung Lu, Hsinchu (TW); Chin-Yuan Liu, Hsinchu (TW); Chun-Kuei Lai, Hsinchu (TW); Pang-Min Chiang, Hsinchu (TW); Chih-Min Lin, MiaoLi (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/867,412

(22) Filed: May 31, 2001

(65) Prior Publication Data
US 2002/0182051 A1 Dec. 5, 2002

(51) Int. Cl.[7] ................................................. B65G 59/06
(52) U.S. Cl. ..................... 414/798.1; 221/297; 221/299
(58) Field of Search ............................ 414/798, 798.1; 221/297, 298, 299, 289

(56) References Cited

U.S. PATENT DOCUMENTS

| | | | | | |
|---|---|---|---|---|---|
| 3,342,350 | A | * | 9/1967 | Seragnoli | 198/347.3 |
| 3,443,706 | A | * | 5/1969 | Puhm | 221/251 |
| 4,271,980 | A | * | 6/1981 | Frieser et al. | 221/297 |
| 4,323,169 | A | * | 4/1982 | Guigan | 221/124 |
| 5,411,363 | A | * | 5/1995 | Ishii | 414/795.9 |
| 5,674,047 | A | * | 10/1997 | Lapeus et al. | 414/795.6 |

* cited by examiner

*Primary Examiner*—Janice L. Krizek
*Assistant Examiner*—Michael J. Kwon
(74) *Attorney, Agent, or Firm*—Troxell Law Office PLLC

(57) ABSTRACT

A Tray input-output module, comprising a power unit, a clamp unit and a support unit, is capable of automatically retrieving a tray from a transport device and automatically delivering a tray to a transport device for facilitating automation in chip sorter operation, reducing manual work and raising productivity.

6 Claims, 16 Drawing Sheets

TRAY INPUT-OUTPUT MODULE

FIELD OF THE INVENTION

The present invention relates to a tray input-output module and in particular relates to a tray input-output module, capable of delivering a tray to a transport device and retrieving a tray from a transport device, automatically. Allowing full automation of chip sorter, the tray input-output module is able to save manpower, eliminate human error and elevate production efficiency.

BACKGROUND OF THE INVENTION

While automation has been the target of modern industry in the perpetual quest for efficiency and competitiveness, manual operation exists in certain processes and full automation remains a future goal. Efficiency and competitiveness continue to advance as more automatic processes replace manual operations.

a. Prior art

The chip sorter in the semiconductor industry is being used to illustrate the prior art. FIG. 1 shows the known chip sorter in the prior art, comprising a platform 10, a robot arm 11 and a transport device 12. A wafer is divided into a number of dies 21 and placed on a platform 10. The main function of the chip sorter is to pick up a die 21 and place it onto a tray 3. First, an operator sets a tray 3 on one end of transport device 12, which then carries the tray 3 to a sorter position. Robot arm 11 of chip sorter picks up die 21 on platform 10 and loads it onto tray 3 until the tray 3 is full. The tray 3 is transferred by transport device 12 to a next stop before being removed by another operator.

It is clear from the above description that the chip sorter in the prior art is not capable of automatically delivering tray to transport device and retrieving tray from transport device. Requiring manual work, such operations are less efficient due to additional labor cost.

SUMMARY OF THE INVENTION

Aimed at resolving the above disadvantage, it is the object of the present invention to provide a tray input module, capable of delivering a tray to transport device and retrieving a tray from transport device.

It is another object of the present invention to provide a tray output module, capable of retrieving a tray from transport device.

The following Description and Designation of Drawings are provided in order to help understand the features and content of the present invention.

BRIEF DESCRIPTION OF DRAWINGS

The accompanying drawings form a material part of this description, in which.

DETAILED DESCRIPTION OF THE PREFERRED EMBODIMENT

In the following description, the present invention is described in connection with specific and preferred embodiments. It will be understood that the present invention is not limited to these embodiments, but rather is to be construed as the spirit and scope defined by the appended claims.

In the present specification, the structure and process are described as comprising specific components and steps, respectively. It is within the contemplation of the present inventors that the structure and process can consist essentially of, or consist of, the disclosed components and steps, respectively.

In order to resolve the aforementioned disadvantages, the present invention discloses a novel tray input-output module comprising a tray input module and a tray output module, wherein the tray input module is capable of automatically converting a whole stack of trays into single trays, two stacked trays, a plurality of stacked trays, or their combination as programmed and place said trays on the transport device for transferring to a next station, and the tray output module is able to automatically remove, one at a time, from the transport device individual trays and pile them up as a single stack.

a. Tray input module:

The tray input module in accordance with the first preferred embodiment of the present invention comprises a power unit 4, a clamp unit 5 and a support unit 6.

Figure 1:
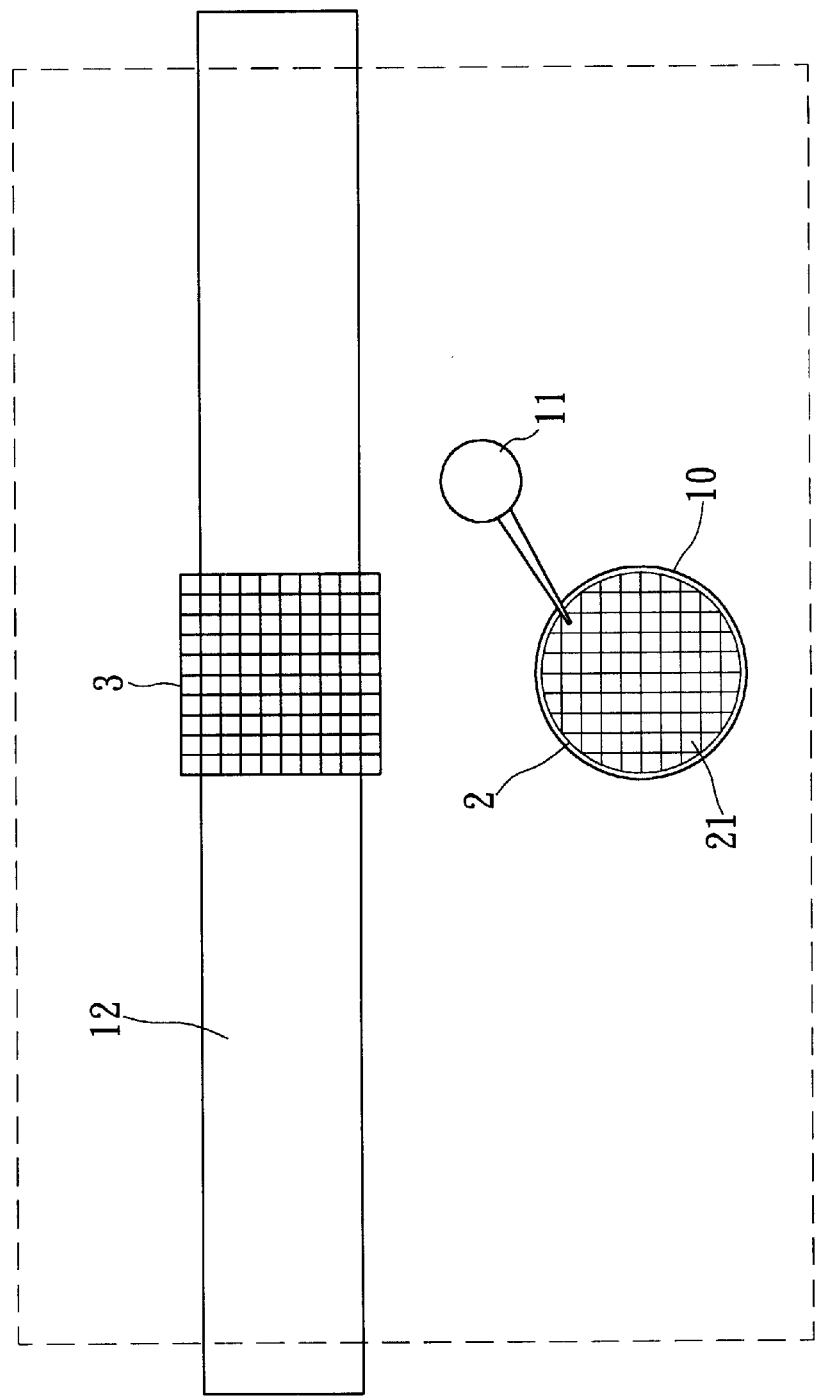
FIG. 1 is a perspective view of a prior art chip sorter.
Figure 2A:
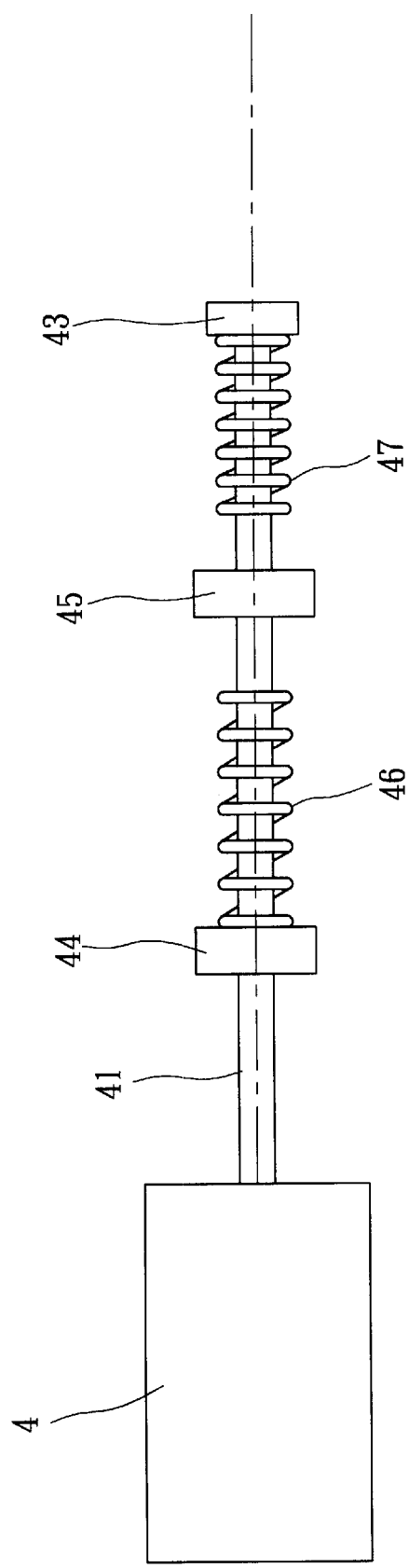
FIG. 2A is a perspective view of the first power unit of the tray input module in accordance with the first preferred embodiment of the present invention.
Figure 2B:
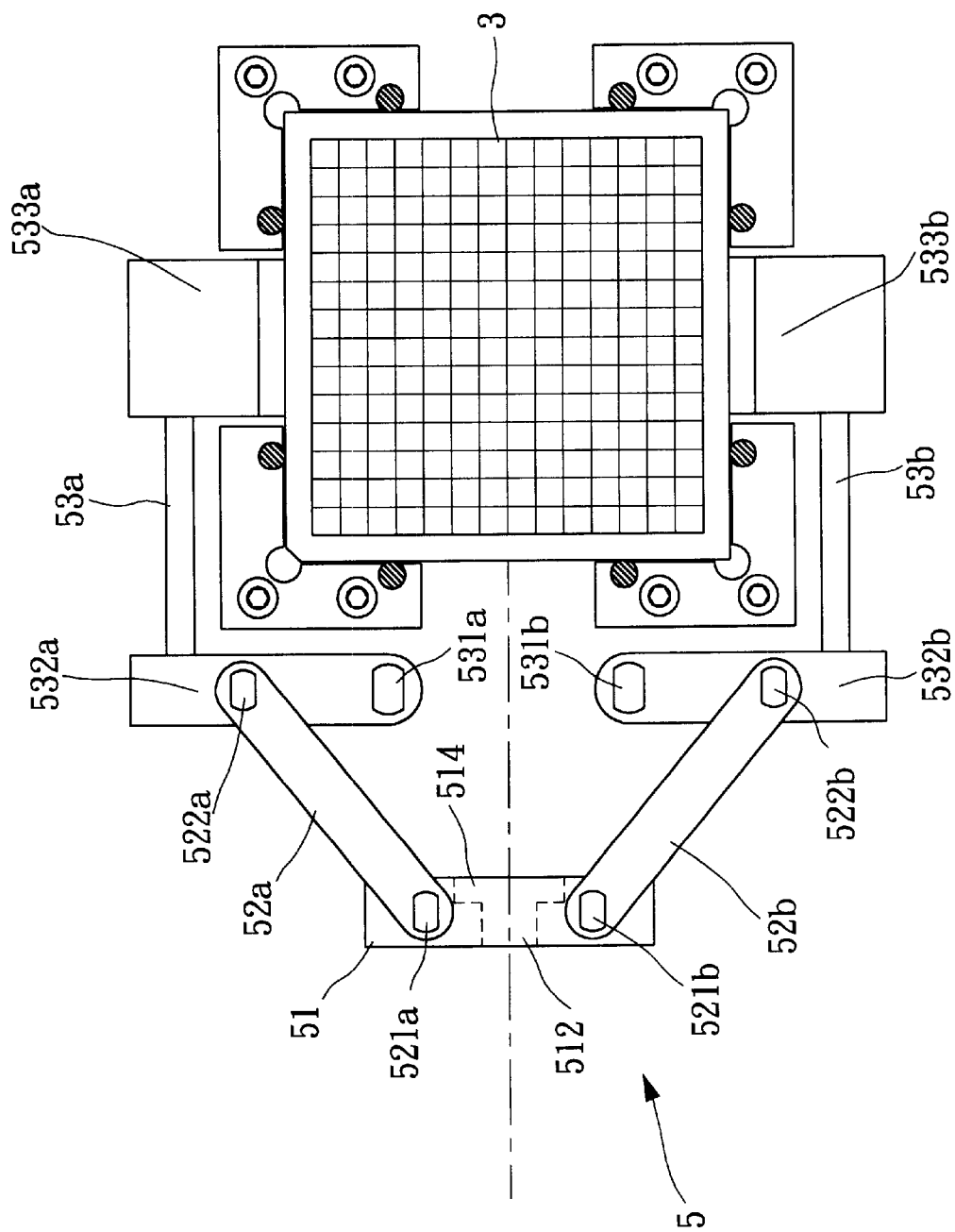
FIG. 2B is a perspective view of the clamp unit of the tray input module in accordance with the first preferred embodiment of the present invention.

FIG. 2A shows a perspective view of the first power unit 4 of the tray input module in accordance with the first preferred embodiment of the present invention. The first power unit 4 is a cylinder having a push rod 41. A front stopper 43, a back stopper 44 and a middle stopper 45 are provided in the front, back and middle of the push rod 41, respectively. A first spring 46 is provided between the middle stopper 45 and the back stopper 44 and a second spring 47 provided between the middle stopper 45 and the front stopper 43.

FIG. 2A shows a perspective view of a clamp unit 5 of the tray input module in accordance with the first preferred embodiment of the present invention.

The clamp unit 5 comprises an upper slider 51, two connecting rods 52a, 52b, and two levers 53a, 53b. Situated between the first spring 46 and the middle stopper 45, the upper slider 51 has a round hole 512 for accepting the push rod 41 (not shown). A container 514 having a shape that complements the middle stopper 45 is provided in front of the upper slider 51. When the first spring 46 is not loaded, the middle stopper 45 is located in the container 514. The two connecting rods 52a and 52b provide two first ends 521a and 521b and two second ends 522a and 522b, respectively. The two levers 53a and 53b provide two support points 531a and 531b, respectively, two load points 532a and 532b, respectively, and two clamp parts 533a and 533b, respectively. The two first ends 521a and 521b are connected with the sides of the upper slider 51, symmetrically, and the two second ends 522a and 522b are linked to the two load points 532a and 532b, respectively. The two connecting rods 52a and 52b drive the two levers 53a and 53b and cause the two clamp parts 533a and 533b to retract and clamp the tray 3 by the two sides.

Figure 2C:
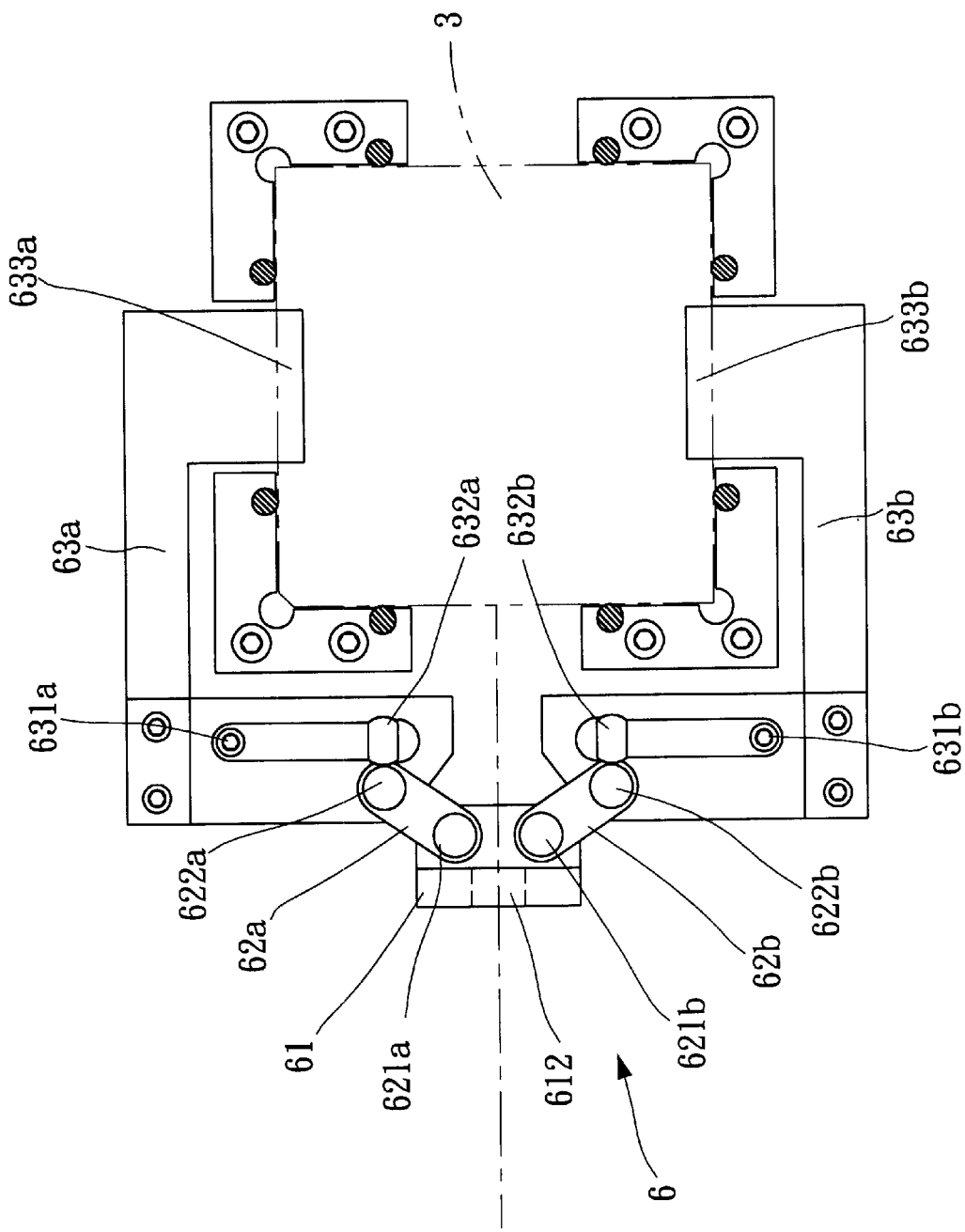
FIG. 2C is a perspective view of the support unit of the tray input module in accordance with the first preferred embodiment of the present invention.

FIG. 2C shows a perspective view of a support unit 6 of the tray input module in accordance with the first preferred embodiment of the present invention. The support unit 6 comprises a lower slider 61, two connecting rods 62a, 62b, and two levers 63a, 63b. Situated between the second spring 47 and the middle stopper 45 and at a proper distance away from the middle stopper 45, the lower slider 61 has a round hole 612 for accepting the push rod 41 (not shown). The two connecting rods 62a and 62b provide two first ends 621a and 621b and two second ends 622a and 622b, respectively. The two levers 63a and 63b provide two support points 631a and 631b, respectively, two load points 632a and 632b, respectively, and two clamp parts 633a and 633b, respectively. The two first ends 621a and 621b are connected with the sides of the lower slider 61, symmetrically, and the two second ends 622a and 622b are linked to the two load points 632a and 632b, respectively. The two connecting rods 62a and 62b drive the two levers 63a and 63b and cause the two support parts 633a and 633b to open up and let go of the tray 3.

Figure 3:
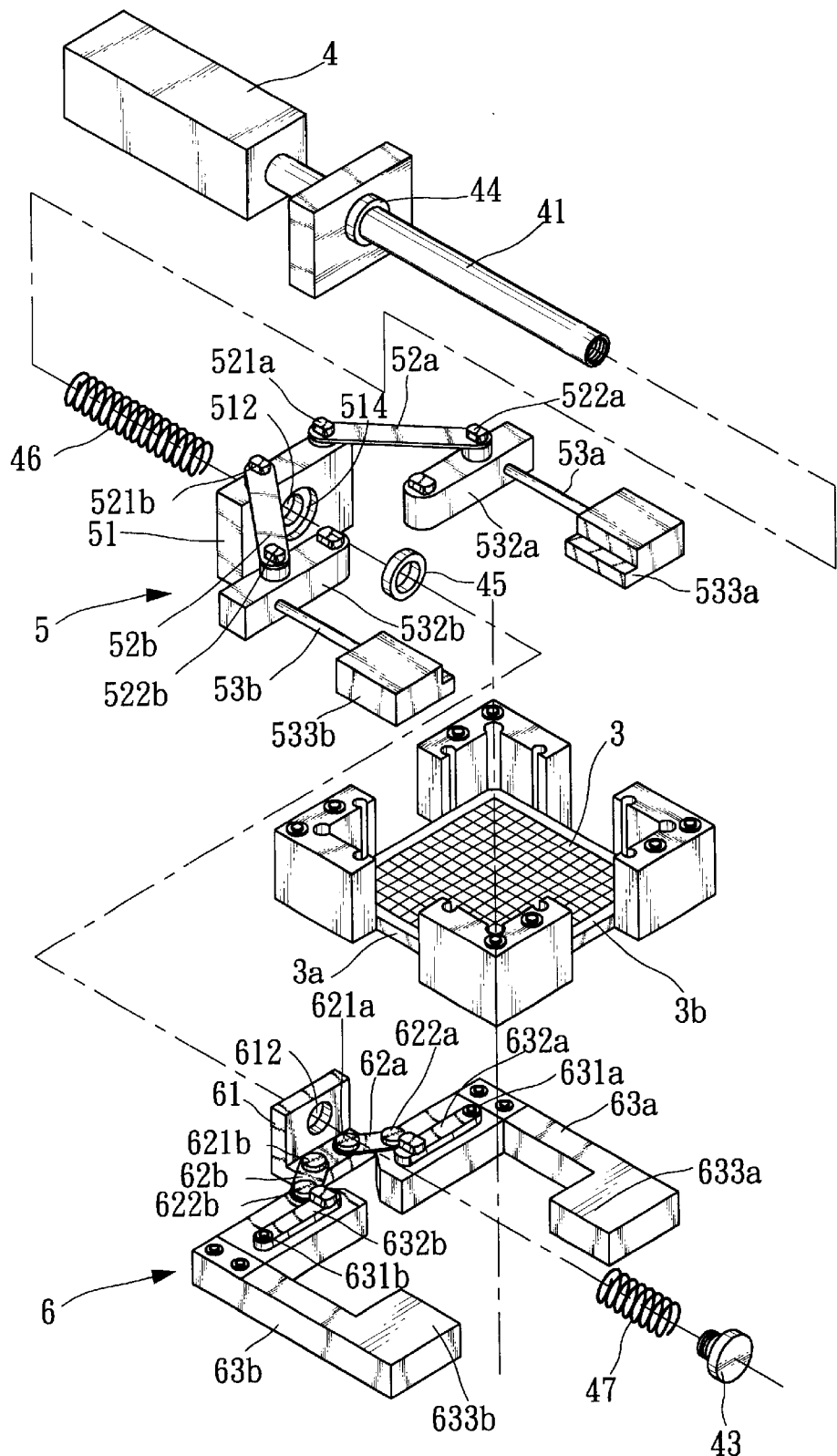
FIG. 3 is an exploded view of the tray input module in accordance with the first preferred embodiment of the present invention.

FIG. 3 is an exploded view of the tray input module in accordance with the first preferred embodiment of the present invention. The operation of the tray input module is as follows. Having a stack of empty trays 3 in the tray input module such that the bottom tray 3a rests on the two support parts 633a and 633b and the tray 3b above tray 3a lies on the two clamp parts 533a and 533b, and being driven by first power unit 4 via the push rod 41, the upper slider 51 of the clamp unit 5 moves forward by the expanding force of the first spring 46 and causes the two clamp parts 533a and 533b to retract and clamp hold of the tray 3b. As the loaded first spring 46 shortens, the lower slider 61 of the support unit 6, driven by the middle stopper 45, moves forward and causes the two support parts 633a and 633b to open up and place the tray 3a on the transport device 12.

Since the middle stopper 45 and the lower slider 61 are separated at a proper distance in the first preferred embodiment of the present invention, a time differential exists between the operations of the clamp unit 5 and the support unit 6. That is, the support unit 6 will let go of the tray 3a only after the clamp unit 5 clamps hold of the tray 3b so as to ensure that only one tray 3 is being released in a single operation.

As the first power unit 4 drives the push rod 41, the lower slider 61 of the support unit 6 moves backward by the recovery force of the first spring 46 and causes the two support parts 633a and 633b to return to the support position. Then the recovery force of the first spring 46 moves the upper slider 51 of the clamp unit 5 backward and causes the two clamp parts 533a and 533b to open up so as to let go of the tray 3b and place it on the two support parts 633a and 633b. The tray input module can automatically deliver the tray 3 by repeating the above procedures.

b. Tray output module:

The tray output module in accordance with the second preferred embodiment of the present invention includes a first power unit 7, a clamp unit 8, a support unit 9, and a second power unit 7a.

Figure 4A:
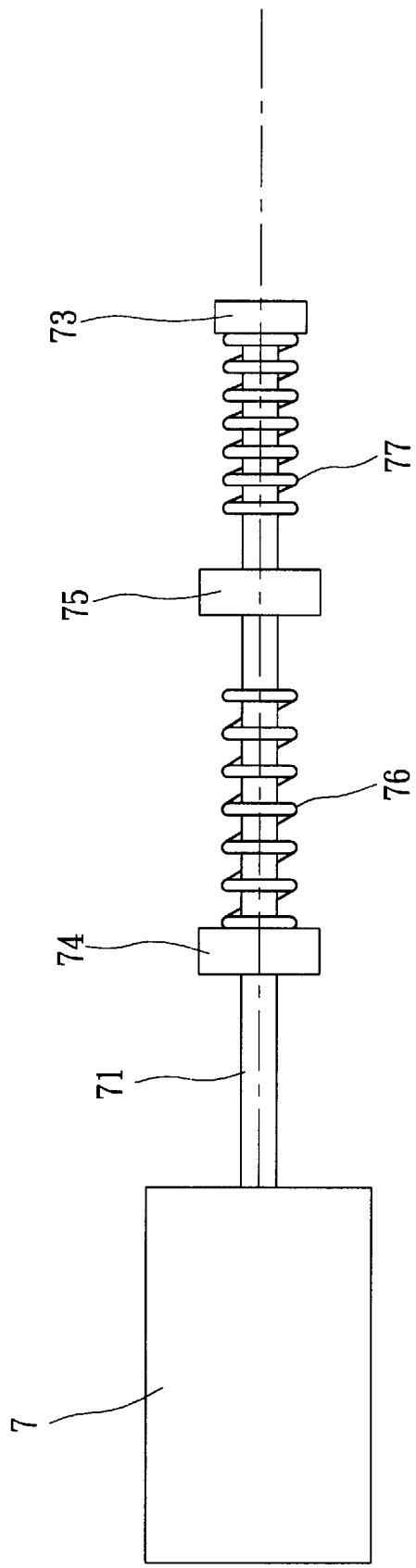
FIG. 4A is a perspective view of the first power unit of the tray output module in accordance with the second preferred embodiment of the present invention.

FIG. 4A is a perspective view of the first power unit 7 of the tray output module in accordance with the second preferred embodiment of the present invention. The first power unit 7 is a cylinder having a first push rod 71. A front stopper 73, a back stopper 74 and a middle stopper 75 are provided in the front, back and middle of the first push rod 71, respectively. A first spring 76 is provided between the middle stopper 75 and the back stopper 74 and a second spring 77 provided between the middle stopper 75 and the front stopper 73.

Figure 4B:
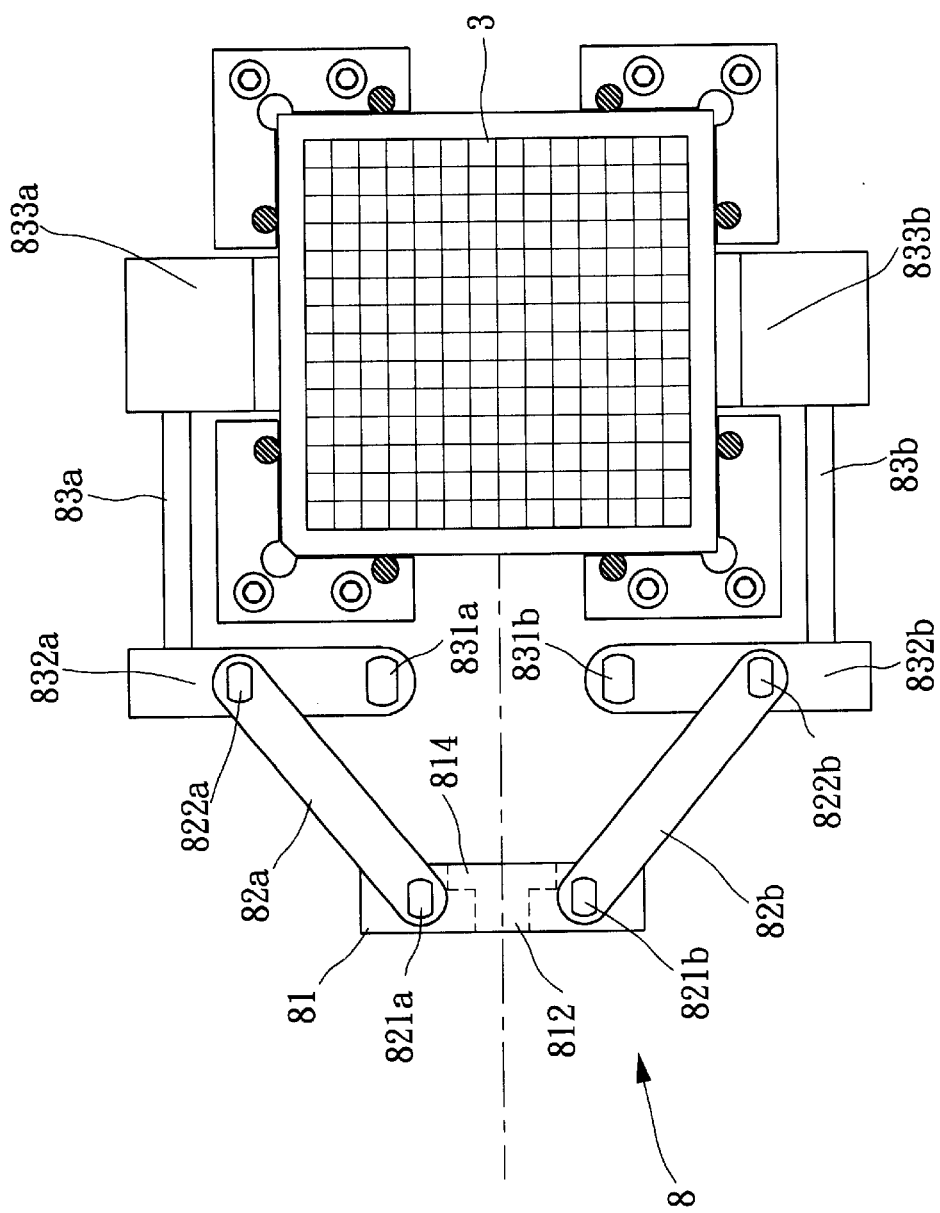
FIG. 4B is a perspective view of the clamp unit of the tray output module in accordance with the second preferred embodiment of the present invention.

FIG. 4B is a perspective view of the clamp unit 8 of the tray output module in accordance with the second preferred embodiment of the present invention. The clamp unit 8 comprises an upper slider 81, two connecting rods 82a, 82b, and two levers 83a, 83b. Situated between the first spring 76 and the middle stopper 75, the upper slider 81 has a round hole 812 for accepting the first push rod 71 (not shown). A container 814 having a shape that complements the middle stopper 75 is provided in front of the upper slider 81. When the first spring 76 is not loaded, the middle stopper 75 is located in the container 814. The two connecting rods 82a and 82b provide two first ends 821a and 821b and two second ends 822a and 822b, respectively. The two levers 83a and 83b provides two support points 831a and 831b, respectively, two load points 832a and 832b, respectively, and two clamp parts 833a and 833b, respectively. The two connecting rods 82a and 82b drive the two levers 83a and 83b and cause the two clamp parts 833a and 833b to retract and clamp hold of the tray 3 by the two sides.

Figure 4C:
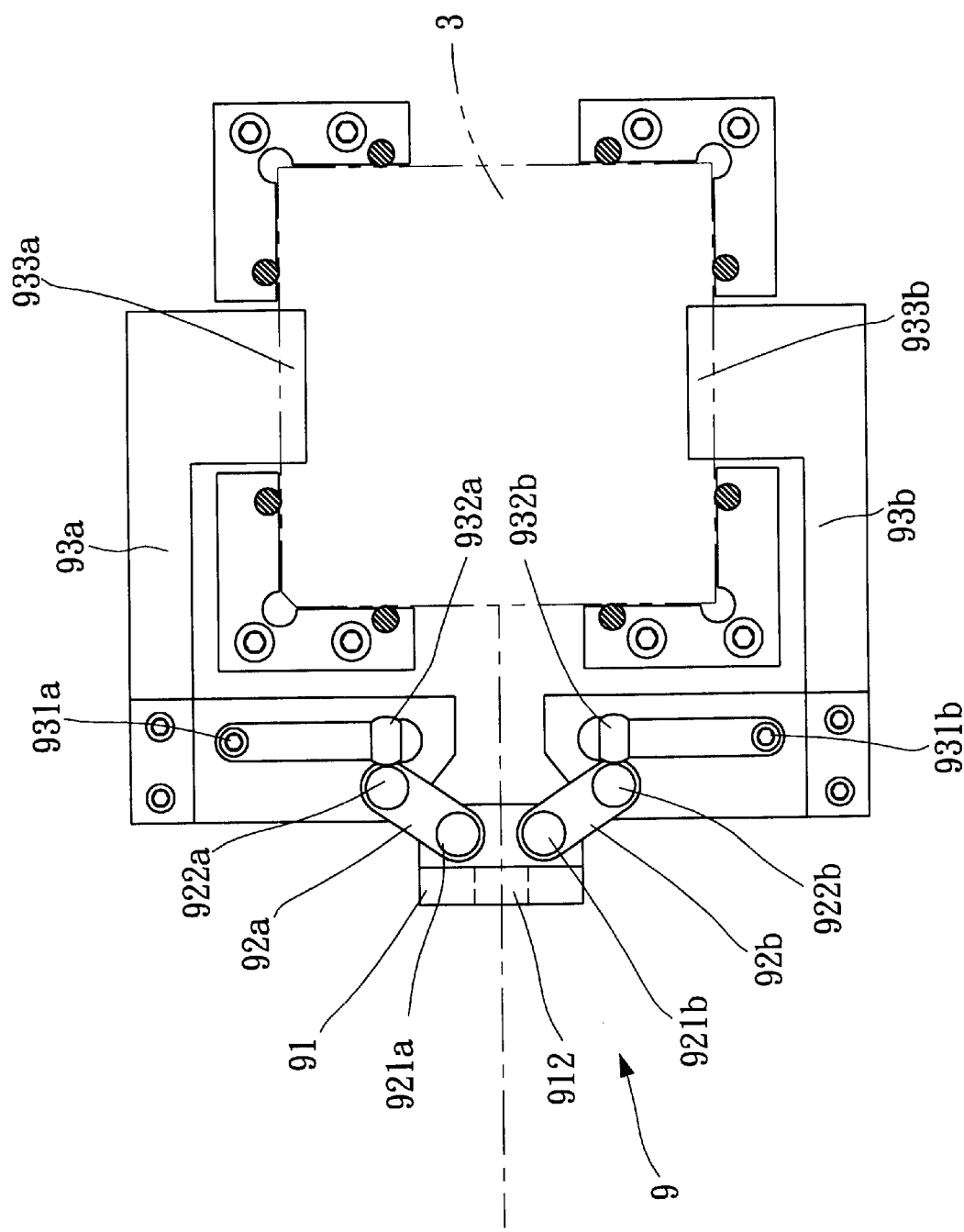
FIG. 4C is a perspective view of the support unit of the tray output module in accordance with the second preferred embodiment of the present invention.

FIG. 4C is a perspective view of the support unit 9 of the tray output module in accordance with the second preferred embodiment of the present invention. The support unit 9 comprises a lower slider 91, two connecting rods 92a, 92b, and two levers 93a, 93b. Situated between the second spring 77 and the middle stopper 75 and at a proper distance away from the middle stopper 45, the lower slider 61 has a round hole 912 for accepting the first push rod 71 (not shown). The two connecting rods 92a and 92b provide two first ends 921a and 921b and two second ends 922a and 922b, respectively. The two levers 93a and 93b provides two support points 931a and 931b, respectively, two load points 932a and 932b, respectively, and two clamp parts 933a and 933b, respectively. The two first ends 921a and 921b are connected with the sides of the lower slider 91, symmetrically, and the two second ends 922a and 922b are linked to the two load points 932a and 932b, respectively. The two connecting rods 92a and 92b drive the two levers 93a and 93b and cause the two support parts 933a and 933b to open up and let go of the tray 3.

Figure 4D:
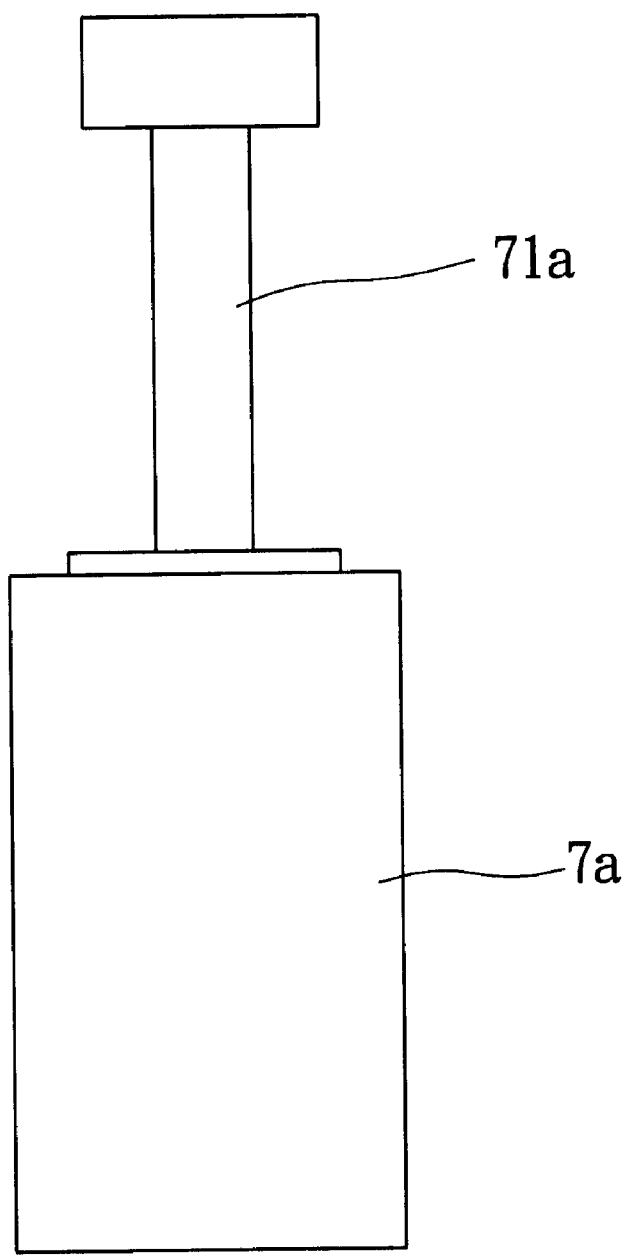
FIG. 4D is a perspective view of the second power unit of the tray output module in accordance with the second preferred embodiment of the present invention.

FIG. 4D is a perspective view of the second power unit 7a of the tray output module in accordance with the second preferred embodiment of the present invention. Located below the support unit 9, the second power unit 7a is a cylinder having a second push rod 71a.

Figure 5:
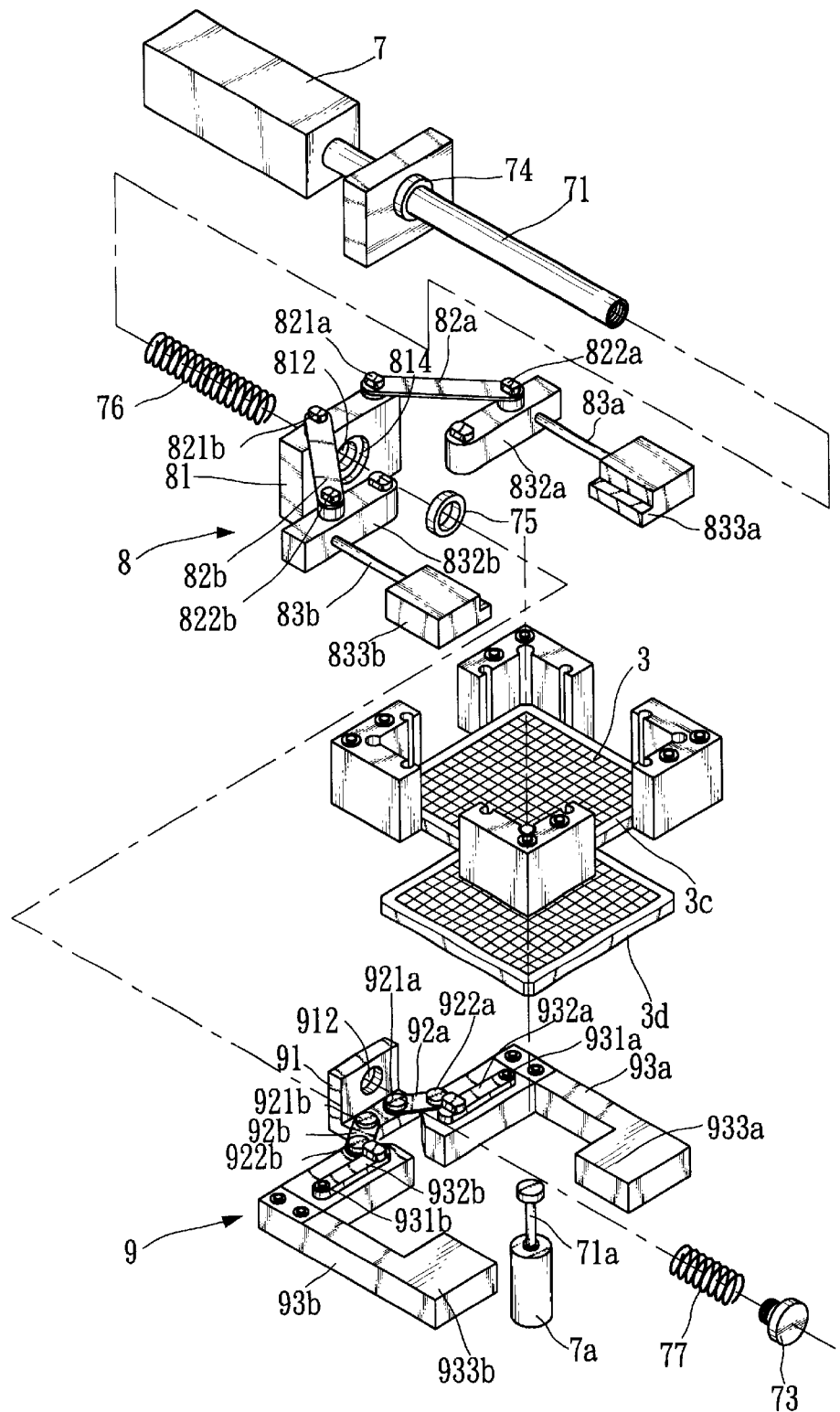
FIG. 5 is an exploded view of the tray output module in accordance with the second preferred embodiment of the present invention.

FIG. 5 is an exploded view of the tray output module in accordance with the second preferred embodiment of the present invention. A plurality of trays 3 is placed on the support unit 9 of the tray output module wherein a bottom tray 3c is situated between the two clamp parts 833a and 833b and on top of the two support parts 933a and 933b. When a tray 3d full of dies 21 is being transferred by a transport device 12 to a location below the support unit 9, a first push rod 71 of a first power unit 7 drives forward a first spring 76 to move an upper slider 81 of a clamp unit 8 and causes two clamp parts 833a and 833b to retract and clamp hold of the tray 3c. As the loaded first spring 76 shortens, the lower slider 91 of the support unit 9, driven by the middle stopper 75, moves forward and causes the two support parts 933a and 933b to open up and let go of the tray 3c. When the tray 3d lies beneath the tray 3c, a second push rod 71a of a second power unit 7 pushes the tray 3d up. Being thin elastic material, the two connecting rods 82a and 82b are capable of curving up under load such that the tray 3d originally under the support unit 9 will be pushed to a location above the two support parts 933a and 933b.

As the first power unit 7 drives the first push rod 71, the lower slider 91 of the support unit 6 moves backward by the recovery force of the second spring 77 and causes the two support parts 933a and 933b to return to the support position. Meanwhile, the upper slider 81 of the clamp unit 8 moves backward by the recovery force of the first spring 76 and causes the two clamp parts 833a and 833b to let go of the tray 3c.

Figure 7:
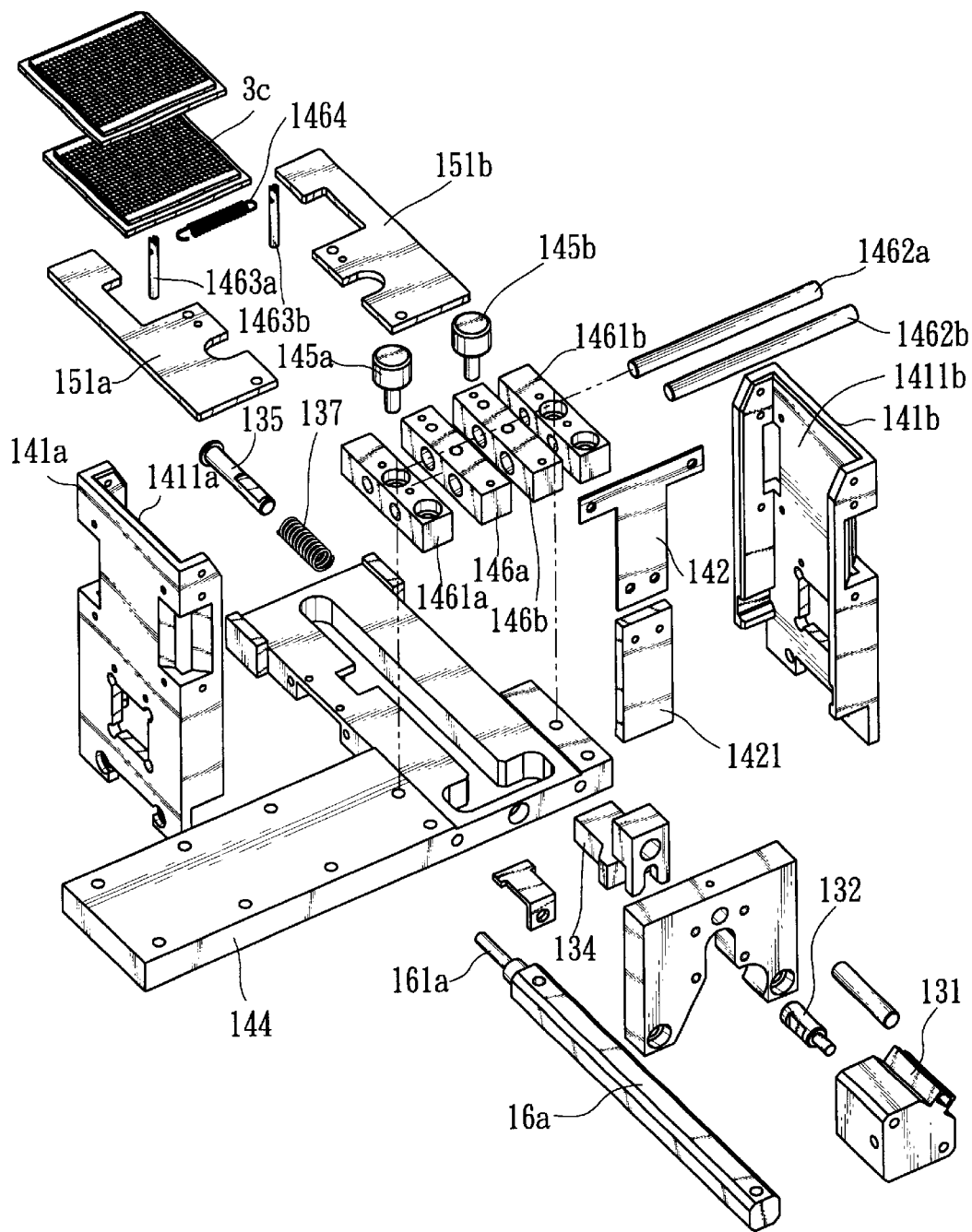
FIG. 7 is an exploded view of the tray input module in accordance with the third preferred embodiment of the present invention.
Figure 8:
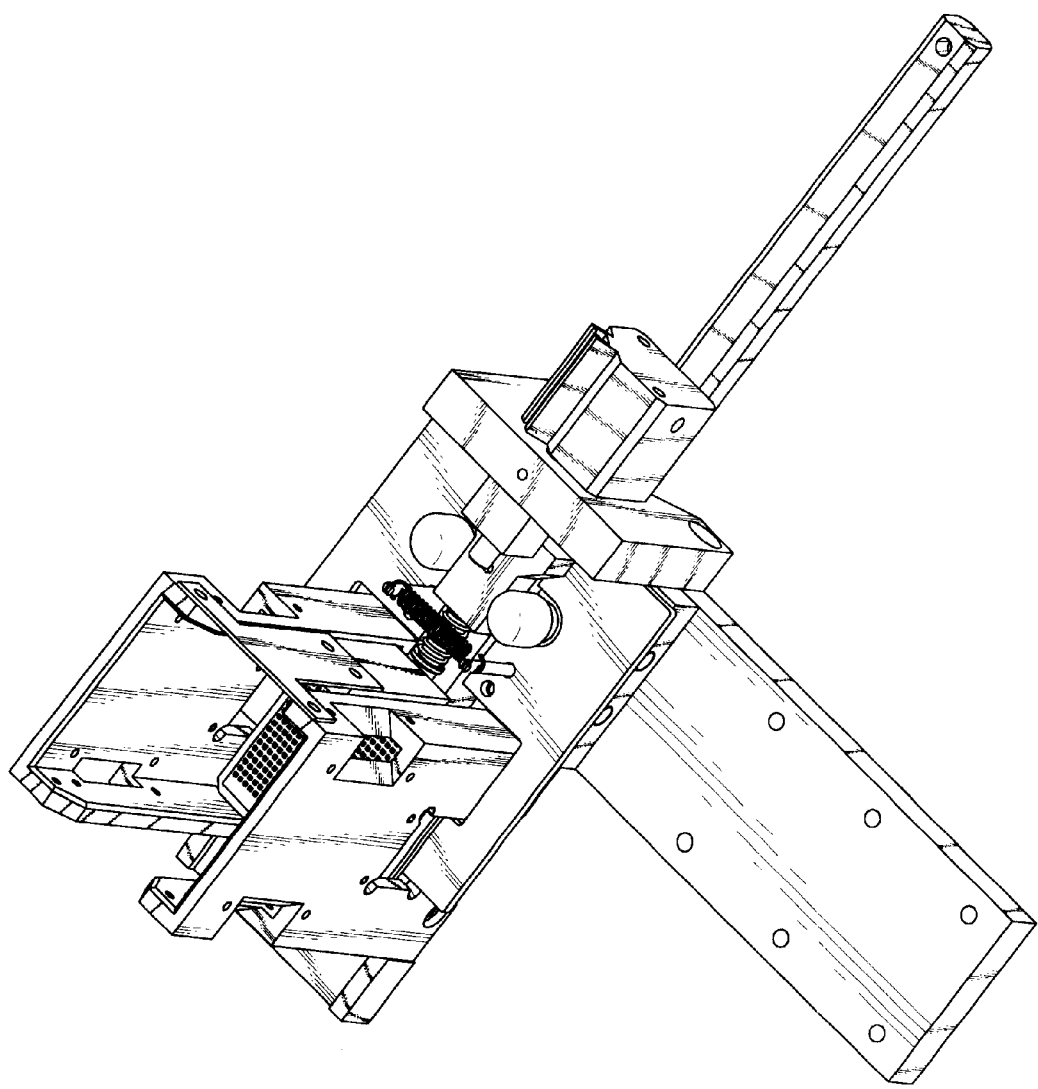
FIG. 8 is a three-dimensional view of the tray input module in accordance with the third preferred embodiment of the present invention.

The second power unit 7a drives downward the first push rod 71a to cause the tray 3d to be placed on the two support parts 933a and 933b. By repeating the above procedures, the tray output module can automatically deliver the tray 3 from the 12-transport device.

c. Tray input module:

FIG. 7 and FIG. 8 show an exploded view and a three-dimensional view of the tray input module, respectively, in accordance with the third preferred embodiment of the present invention, wherein said tray input module comprises a first power unit 13, a clamp unit 14, a support unit 15 and a second power unit 16.

Figure 6A:
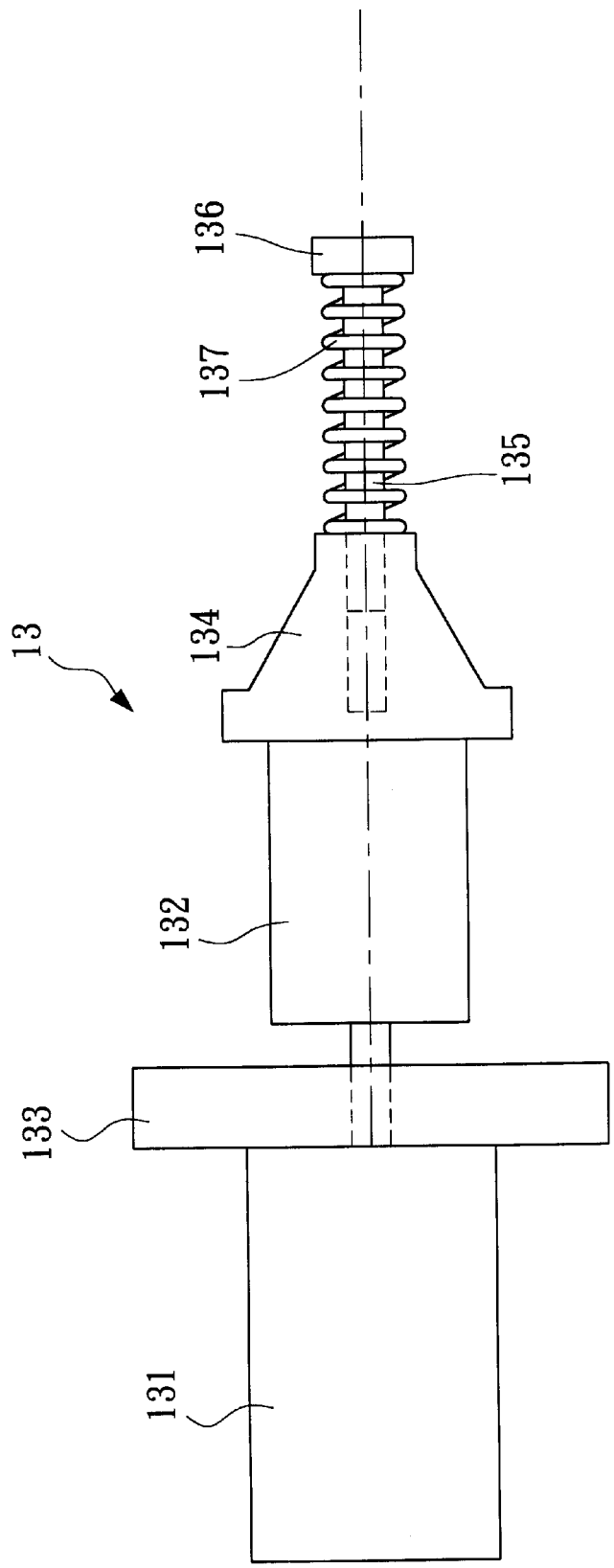
FIG. 6A is a perspective view of the first power unit of the tray input module in accordance with the third preferred embodiment of the present invention.

FIG. 6A shows a perspective view of the first power unit 13 of the tray input module in accordance with the third preferred embodiment of the present invention, wherein the first power unit 13 includes a cylinder 131, a cylinder connector 132, a push rod base 134, a push rod 135, a compression spring 137. One end of the cylinder connector 132 is secured to the cylinder 131 and the other end secured to the push rod base 134. The push rod 135 is provided in front of the push rod base 134. A front protrusion 136 is provided on the front end of said push rod 135. Disposed around the push rod 135, a compression spring 137 is provided between the front protrusion 136 and the push rod base 134.

Figure 6B:
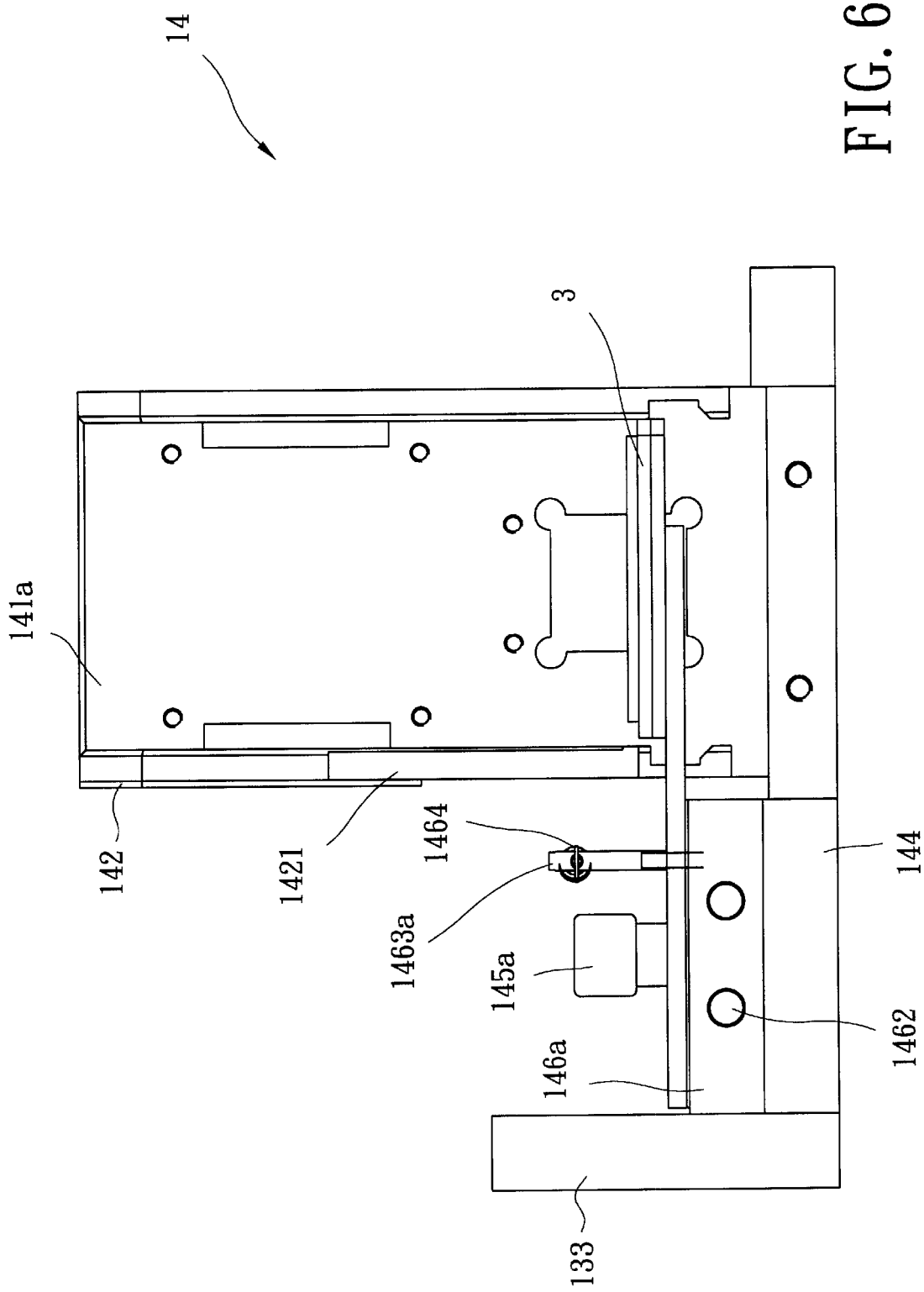
FIG. 6B is a perspective view of the clamp unit of the tray input module in accordance with the third preferred embodiment of the present invention.

FIG. 6B shows a perspective view of the clamp unit 14 of the tray input module in accordance with the third preferred embodiment of the present invention, wherein the clamp unit 14 has two tray supporters 141, a stopper spring 142, a tray stopper 1421, a base 144, two rollers 145, two sliders 146a and 146b, two slider rod bases 1461a and 1461b, two push rod bases 1462a and 1462b, two spring pins 1463a and 1463b and an extension spring 1464.

Providing one of the rectangular openings 1411a and 1411b respectively on each of the lower part, the two tray supporters 141a and 141b are secured to the base 144 in symmetrical fashion for containing a stack of trays 3. Being T-shaped or any other suitable shape, the stopper spring 142 has the tray supporters 141a and 141b secured to its upper end and the tray stopper 1421 to its lower end, respectively. The slider rod bases 1461a and 1461b are secured to the base 144 symmetrically. The two sliders 146a and 146b are provided symmetrically between the slider rod bases 1461a and 1461b. The two push rod bases 1462a and 1462b are provided, respectively, in two through holes that are supplied through the two slider rod bases 1461a and 1461b and the two sliders 146a and 146b. The two rollers 145a, 145b are provided above the two sliders 146a, 146b and the two spring pins 1463a, 1463b are secured to the two sliders 146a, 146b. The extension spring 1464 is disposed between the two spring pins 1463a and 1463b.

Figure 6C:
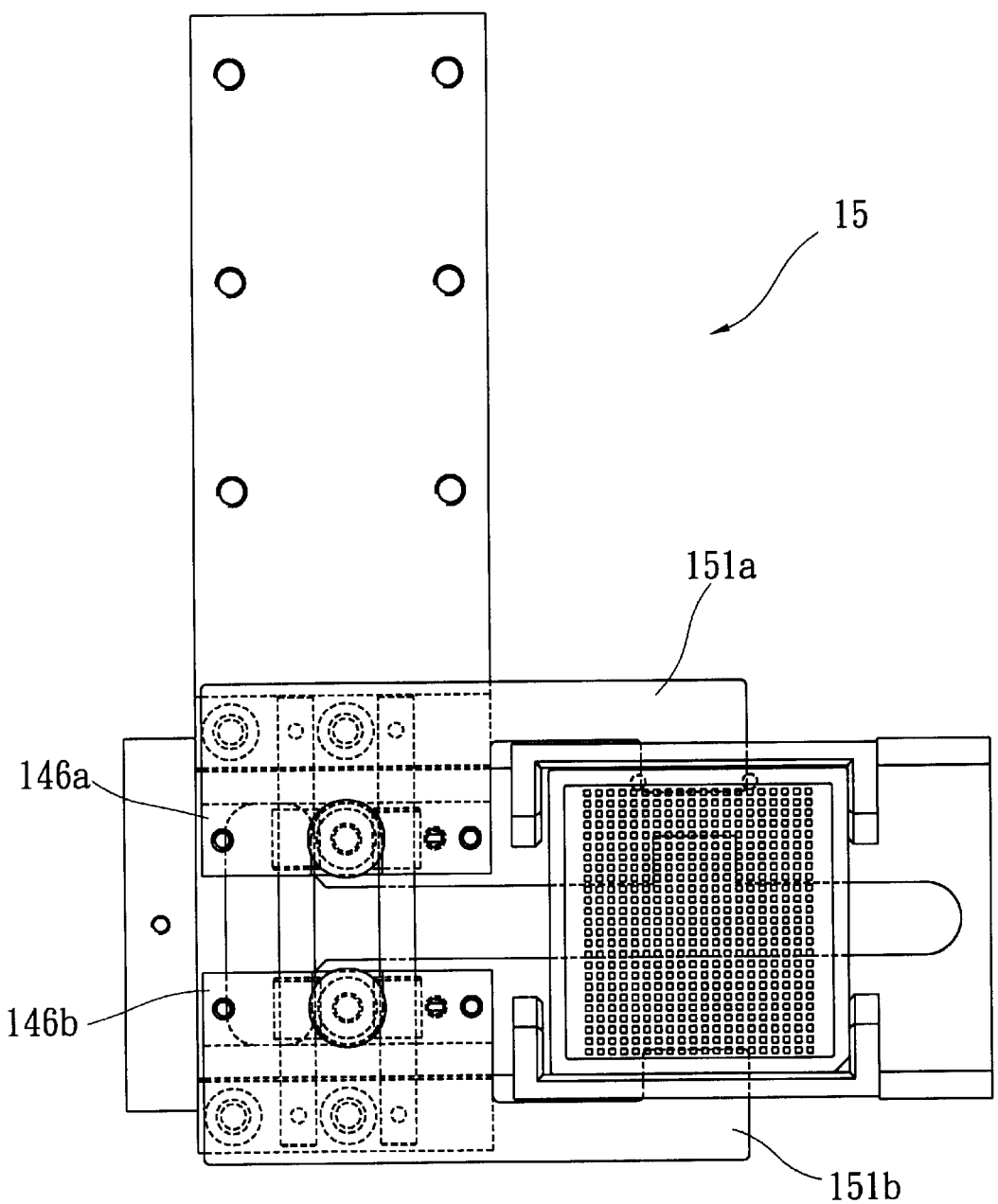
FIG. 6C is a perspective view of the support unit of the tray input module in accordance with the third preferred embodiment of the present invention.

FIG. 6C shows a perspective view of the support unit 15 of the tray input module in accordance with the third preferred embodiment of the present invention. The support unit 15 has two tray holders 151a and 151b, being secured to the sliders 146a and 146b, respectively.

Figure 6D:
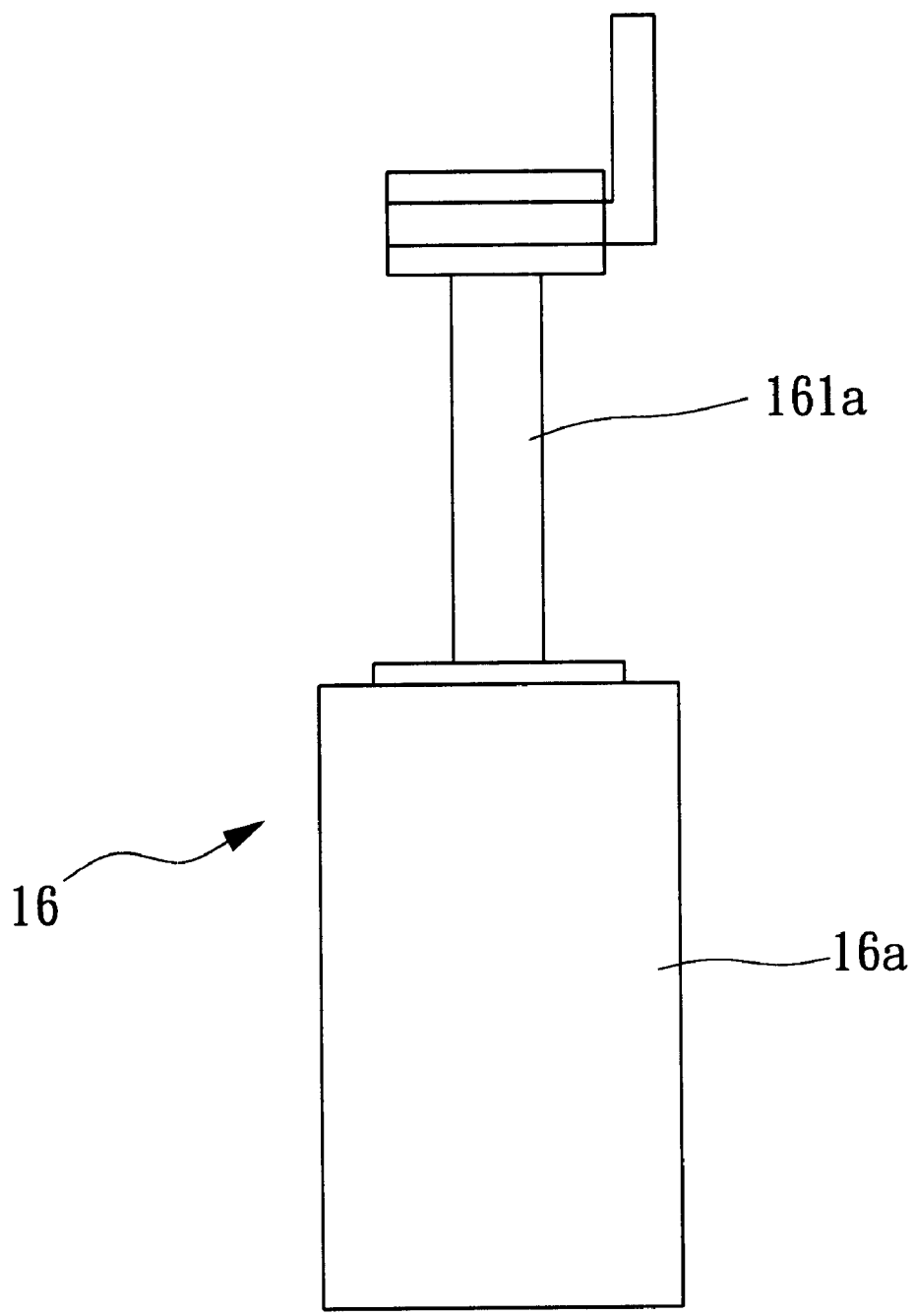
FIG. 6D is a perspective view of the second power unit of the tray input module in accordance with the third preferred embodiment of the present invention.

FIG. 6D shows a perspective view of the second power unit 16 of the tray input module in accordance with the third preferred embodiment of the present invention. Provided below the support unit 15, the second power unit 16 is a cylinder 16a having a push rod 161a.

FIG. 7 and FIG. 8 are an exploded view and a three-dimensional view of the tray input module in accordance with the third preferred embodiment of the present invention. A plurality of trays 3 are provided on the support unit 15 wherein a bottom tray 3c is disposed on the same height as the tray stopper 1421 and the tray 3c is arranged above two tray holders 151a and 151b of the support unit 15. The operation in accordance with the third embodiment is as follows. As a stack of trays 3 is provided horizontally in a clamp unit 14, the two tray holders 151a and 151b of the support unit 15 enter the rectangular openings 1411a and 1411b, respectively, and hold the stack 3 by the lower sides. When the input module in accordance with the third embodiment is scheduled to deliver a single tray in a single operation, the cylinder 131 as shown in FIG. 6A provides the driving force for the tray stopper 1421 to move forward and the elastic deflection of the stopper spring 142 allows the tray stopper 1421 to advance and move the whole stack of trays except the bottom tray until the stack is up against the wall of the tray supporters 141. Still driven horizontally by the cylinder 131, the tray stopper 1421 firmly clamps the stack of trays, being above and separated from the bottom tray, against the vertical wall of the tray supporters 141. When the cylinder 131 continues to drive in sliding fashion the cylinder connector 132 and the push rod base 134, the push rod base 134 advances as it presses against the compression spring 137. Meanwhile, the slope on both sides of the push rod base 134 starts to press and cause the rollers 145a and 145b to move away in opposite directions. Being attached to the rollers 145a and 145b, the sliders 146a and 146b move accordingly as the rollers 145a and 145b move away in opposite directions, thus causing the tray holders 151a and 151b (See FIG. 6C) to move away from each other. When the distance between the tray holders 151a and 151b exceeds the width of the tray, the bottom tray falls through between the tray holders 151a and 151b and lands onto the base 144 while said stack of trays, already above and separated from the bottom tray, are still being clamped in place between the tray stopper 1421 and the tray supporters 141. After the bottom tray lands onto the base 144, the push rod 161a driven by cylinder 16a pushes the bottom tray onto the transport device 12 for transporting to a next station. At the same time, the push rod base 134 stops and the cylinder 131 also ceases to drive. Since the compression spring 137 is loaded, its elastic tension now pushes back the push rod base 134 in the absence of the cylinder 131's driving force. Meanwhile, the extension spring 1464, being in an expansion state, now pulls the sliders 146a and 146b to move towards each other. As the push rod base 134 retreats, the rollers 145a and 145b slide along the slope on the sides of the push rod base 134 move towards each other and bring the sliders 146a and 146b towards each other accordingly, thereby causing the tray holders 151a and 151b to move towards each other. When the distance between the tray holders 151 reaches a point of being able to support the tray, the tray holders 151 stop to move and cause the rollers 145 to stop as well. At this point, the compression spring 137 is no longer under compression and thus gradually losses its elastic expansion. When the compression spring 137 gradually stops to push back said push rod base 134 and the tray stopper 1421, and, at the same time, the stopper spring 142 also gradually pushes the tray stopper 1421 back to its original vertical position, the stack of trays is no longer being clamped so that it falls through between the tray stopper 1421 and the tray supporters 141, and is immediately being supported by the tray holders 151, thus completing the first cycle of converting a whole stack of trays into single trays for transferring to the next station. By the same token, two stacked trays, a plurality of stacked trays, or their combination can be accomplished as programmed.

By repeating the above procedures, the tray input module is capable of converting a whole stack of trays to single trays, two stacked trays or a plurality of stacked trays, or their combination to be transferred away by the transport device.

While the invention has been described in terms of a preferred embodiment, various alternatives and modifications can be devised by those skilled in the art without departing from the invention. Accordingly, the present invention is intended to embrace all such alternatives that fall within the scope of the claims.

What is claimed is:

1. A tray input-output module for sequentially delivering a stack of trays, comprising:
   a clamp unit for containing the stack of trays, which further comprises:
      two spaced apart tray supporters for containing the stack of trays;
      a base provided below the two tray supporters for positioning and supporting the tray supporters; and
      a stopper including a stopper spring connected with one side of the two tray supporters such that the stopper is capable of pressing the stack of trays and preventing said stack of trays from falling through the two tray supporters;
   a support unit having:
      two movable tray holders, disposed on a lower part of the two tray supporters and capable of moving horizontally between an open position and a closed position by an application of a force, such that, in the closed position, the two tray holders support the trays above the base and hold them in the two tray holders, and, in the open position, allow at least one tray to land on the base;
      at least one power unit;
      a push rod, positioned so as to move the stopper to press against trays between the two tray holders to retain the trays in the two tray holders; and
      a push rod base moved by the at least one power unit, the push rod base having two slopes for interacting with the two tray holders such that linear displacement of the push rod base causes the two tray holders to be in the open position;
      wherein as the at least one power unit causes the push rod to move the stopper and press against a predetermined tray to keep trays at and above the predetermined tray in place, the at least one power unit moves the push rod base so as to move the two tray holders to the open position allowing trays below the predetermined tray to land on the base.

2. The tray input-output module of claim 1, wherein said at least one power unit includes a first power unit and a second power unit such that the first power unit and the second power unit are capable of moving the two tray holders and the stopper, respectively.

3. The tray input-output module of claims 1, further comprising an additional power unit such that the additional power unit drives an input tray.

4. The tray input-output module of claim 1, wherein the tray stopper is attached to and located below the stopper spring.

5. The tray input-output module of claim 1, further comprising two sliders, two slider rod bases and two slider guides wherein the two sliders are provided between the two slider rod bases and the two sliders and the two slider rod bases slide along the two slider guides, the two sliders being connected to the two tray holders.

6. The tray input-output module of claim 5, further comprising an elastic component provided in front of the two slider rod bases.

* * * * *